(12) United States Patent
Traverso et al.

(10) Patent No.: US 10,608,410 B2
(45) Date of Patent: Mar. 31, 2020

(54) SINGLE FACET LASER SOURCES

(71) Applicant: Cisco Technology, Inc., San Jose, CA (US)

(72) Inventors: Matthew J. Traverso, Santa Clara, CA (US); Dominic F. Siriani, Allentown, PA (US); Mark Webster, Bethlehem, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 16/436,573

(22) Filed: Jun. 10, 2019

(65) Prior Publication Data

US 2019/0319427 A1 Oct. 17, 2019

Related U.S. Application Data

(63) Continuation of application No. 15/953,250, filed on Apr. 13, 2018, now Pat. No. 10,320,151.

(51) Int. Cl.
| | |
|---|---|
| *H01S 5/12* | (2006.01) |
| *H01S 5/10* | (2006.01) |
| *G02B 6/12* | (2006.01) |
| *H01S 5/125* | (2006.01) |
| *H01S 5/028* | (2006.01) |
| *H01S 5/022* | (2006.01) |
| *H01S 5/30* | (2006.01) |
| *H01S 5/22* | (2006.01) |
| *H01S 5/026* | (2006.01) |

(52) U.S. Cl.
CPC ........ *H01S 5/1228* (2013.01); *G02B 6/12004* (2013.01); *H01S 5/101* (2013.01); *H01S 5/1028* (2013.01); *H01S 5/1203* (2013.01); *H01S 5/125* (2013.01); *G02B 2006/1215* (2013.01); *G02B 2006/12147* (2013.01); *H01S 5/026* (2013.01); *H01S 5/0228* (2013.01); *H01S 5/0287* (2013.01); *H01S 5/1003* (2013.01); *H01S 5/1085* (2013.01); *H01S 5/1215* (2013.01); *H01S 5/22* (2013.01); *H01S 5/3013* (2013.01)

(58) Field of Classification Search
None
See application file for complete search history.

(56) References Cited

U.S. PATENT DOCUMENTS

| | | |
|---|---|---|
| 9,755,753 B2 | 9/2017 | Blumenthal |
| 9,941,971 B1 | 4/2018 | Mashanovitch et al. |
| 2014/0078580 A1* | 3/2014 | Hasegawa ............ H01S 5/5036 359/344 |

OTHER PUBLICATIONS

Ketelsen, L. J. P., et al. "Multiwavelength DFB laser array with integrated spot size converters." IEEE journal of quantum electronics 36.6 (2000): 641-648.

(Continued)

*Primary Examiner* — Jerry Rahll
(74) *Attorney, Agent, or Firm* — Patterson + Sheridan, LLP

(57) ABSTRACT

The embodiments herein describe a single-frequency laser source (e.g., a distributed feedback (DFB) laser or distributed Bragg reflector (DBR) laser) that includes a feedback grating or mirror that extends along a waveguide. The grating may be disposed over a portion of the waveguide in an optical gain region in the laser source. Instead of the waveguide or cavity being linear, the laser includes a U-turn region so that two ends of the waveguide terminate at the same facet. That facet is coated with an anti-reflective (AR) coating.

20 Claims, 9 Drawing Sheets

(56) References Cited

OTHER PUBLICATIONS

Tanaka, S., et al. "Flip-chip-bonded, 8-wavelength AlGaInAs DFB laser array operable up to 70° C. for silicon WDM Interconnects." Optical Communication (ECOC), 2014 European Conference on. IEEE, 2014. [Abstract Only] [Accessed Online on Apr. 6, 2018] http://ieeexplore.ieee.org/document/6963970/.
Matsumoto, T., et al. "In-line optical amplification for Si waveguides on 1×8 splitter and selector by flip-chip bonded InP-SOAs." Optical Fiber Communications Conference and Exhibition (OFC), 2016. IEEE, 2016. [Abstract Only] [Accessed Online] http://ieeexplore.ieee.org/document/7537294/.
Jonathan Luff, Dazeng Feng, Daniel C. Lee, Wei Qian, Hong Liang, and Mehdi Asghari, "Hybrid Silicon Photonics for Low-Cost High-Bandwidth Link Applications," Advances in Optical Technologies, vol. 2008, Article ID 245131, 6 pages, 2008. doi:10.1155/2008/245131.
Cunningham, John E., et al. "Integration and packaging of a macrochip with silicon nanophotonic links." IEEE Journal of Selected Topics in Quantum Electronics 17.3 (2011): 546-558. [Abstract Only] [Accessed Online] http://ieeexplore.ieee.org/document/5685655/.
Smit et al., Semi. Sci. & Tech., 29, 083001 (2014).
Stabile & Williams, J. Lightwave Tech., 29, 1892 (2011).
Demir et al., IEEE Photon. Tech. Lett., 27, 2178, 2015.
Garrod et al., ISLC, WS3, 2016.
U.S. Appl. No. 15/953,250 "Single Facet Laser Source," filed Apr. 13, 2018.

* cited by examiner

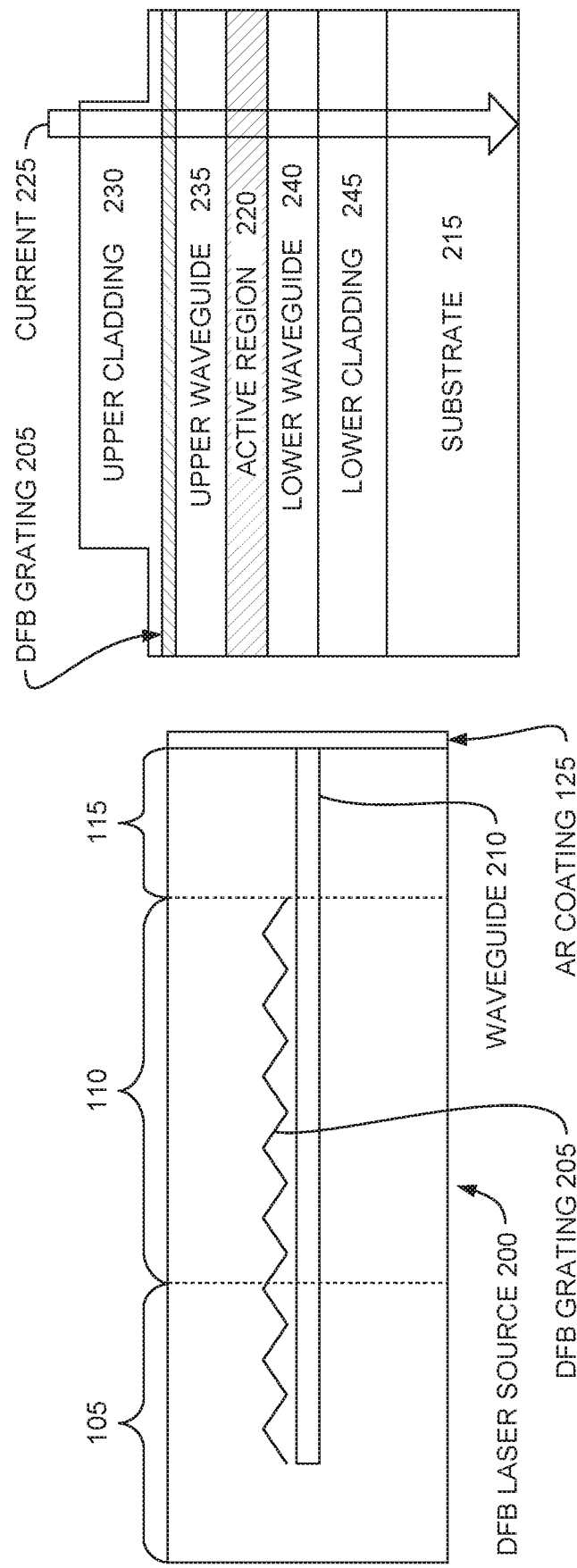

SINGLE FACET LASER SOURCES

CROSS-REFERENCE TO RELATED APPLICATIONS

This application is a continuation of co-pending U.S. patent application Ser. No. 15/953,250, filed Apr. 13, 2018. The aforementioned related patent application is herein incorporated by reference in its entirety.

TECHNICAL FIELD

Embodiments presented in this disclosure generally relate to a laser with a feedback grating and outputs at a shared facet.

BACKGROUND

Distributed feedback (DFB) lasers typically include a first facet which has a partial reflector (i.e., an anti-reflective (AR) coating) and a second facet which has a total reflector (i.e., a high reflective (HR) coating). While the second facet with the total reflector reflects more than 90% of the light in the laser, this configuration results in low threshold current. Further, the second facet is typically fabricated using a mechanical process (e.g., a cleaving process) which is not precise (i.e., has high tolerances). As a result, the phase of the light reflected from the total reflector back towards the partial reflector is uncertain. This grating phase change can cause instability in the HR/AR DFB laser that can result in mode hopping where the wrong wavelength is amplified.

However, using two facets that both have partial reflectors (e.g., the AR coating) can result in low efficiency. That is, although DFB lasers that use AR/AR coatings are inherently less susceptible to grating phase changes at the facets, they suffer from reduced efficiency where significant amounts of light exit from both facets in contrast to the HR/AR DFB laser where almost all the light exits through the facet with the AR coating but not the facet with the HR coating.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 2A-2C illustrate a DFB laser source coupled to a photonic chip, according to embodiments described herein.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
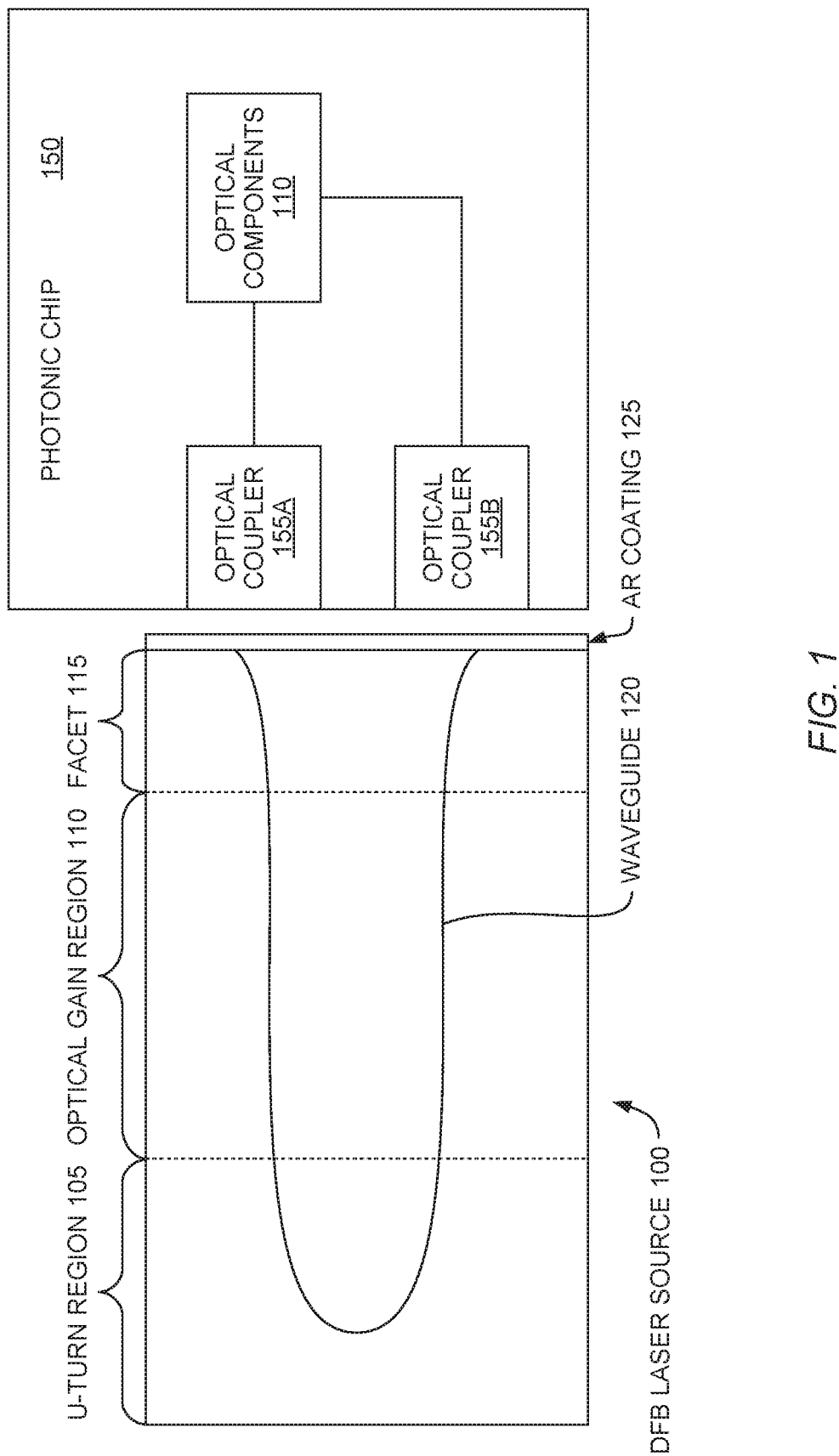
FIG. 1 illustrates a DFB laser source coupled to a photonic chip, according to one embodiment described herein.

One embodiment presented in this disclosure is a laser source that includes a facet coated with an anti-reflective (AR) coating, an intermediate region, a U-turn region, wherein the intermediate region is between the facet and the U-turn region, and a waveguide extending through the facet, the intermediate region, and the U-turn region. A first portion of the waveguide in the U-turn region changes direction such that the waveguide exits the U-turn region in an opposite direction than the portion of the waveguide entered the U-turn region and first and second ends of the waveguide terminate at the facet. The laser source also includes a grating disposed over a second portion of the waveguide in at least one of the intermediate region and the U-turn region where at least one of the intermediate region and the U-turn region provides optical gain to a signal propagating in the waveguide.

Another embodiment described herein is an optical system that includes a laser source that includes a facet coated with an anti-reflective (AR) coating, an intermediate region, a U-turn region, and a waveguide extending through the facet, the intermediate region, and the U-turn region. A first portion of the waveguide in the U-turn region changes direction such that the waveguide exits the U-turn region in an opposite direction than the portion of the waveguide entered the U-turn region and the first and second ends of the waveguide terminate at the facet. The laser source also includes a grating disposed over a second portion of the waveguide in at least one of the intermediate region and the U-turn region. The optical system further includes a photonic chip that includes a first optical coupler aligned to the laser source to receive a first optical signal emitted from the first end of the waveguide via the facet and a second optical coupler aligned to the laser source to receive a second optical signal emitted from the second end of the waveguide via the facet.

EXAMPLE EMBODIMENTS

The embodiments herein describe a single-frequency laser source (e.g., a distributed feedback (DFB) laser or distributed Bragg reflector (DBR) laser) that includes a feedback grating or mirror that extends along a waveguide. Instead of the waveguide or cavity being linear, the laser includes a U-turn region so that two ends of the waveguide terminate at the same facet, which is coated with an AR coating. As such, the laser avoids the grating phase change which can cause instability in an HR/AR laser source resulting from reflecting light off of the HR coated facet.

The laser sources described herein also avoid the problem of low optical efficiency of AR/AR lasers that have two facets since the two ends of the waveguide terminates on the same facet. The two ends can then be optically aligned to optical couplers in a photonic chip. As a result, substantially all of the light is transmitted from the laser source to the photonic chip. For example, the photonic chip may include an optical combiner which combines the light received at the two optical couplers into a single waveguide, or the two optical couplers can be coupled to different optical components in the photonic chip (e.g., to independent modulators).

FIG. 1 illustrates a DFB laser source 100 coupled to a photonic chip 150, according to one embodiment described herein. The DFB laser source 100 includes a U-turn region 105, an optical gain region 110 (or intermediate region), and a facet 115. The U-turn region 105 defines a location of a waveguide 120 in which the light generated by the laser reverses direction such that the two ends of the waveguide 120 exit on the same facet 115. The optical gain region 110 is a region where current is used to generate and/or amplify the light. The facet 115 serves as the output interface of the DFB laser source 100 and is coated with an AR coating 125. Although not shown here, the DFB laser source 100 includes a feedback grating which extends along at least a portion of the waveguide 120 and serves as a mirror for reflecting a particular wavelength of light traveling in the waveguide 120 as optical feedback. In one embodiment, the grating relies on Bragg scattering to provide the optical feedback for the laser source 100. The grating can reflect light back into the waveguide 120 to form a resonator.

The two ends of the waveguide 120 that terminate in the facet are aligned to respective optical couplers 155 in the photonic chip 150. That is, one end of the waveguide 120 aligns with the optical coupler 155A while the other end aligns with the optical coupler 155B. By terminating both ends of the waveguide 120 on the same facet, the ends can be aligned to the same facet of the photonic chip 150. In contrast, in another embodiment, the U-turn region 105 can be replaced with a second facet disposed opposite the first facet 115 such that the one end of the waveguide 120 terminates on the first facet 115 and a second end of the waveguide 120 terminates at an AR coating on the second facet. In this example, the waveguide 120 is linear and does not change direction as it extends between the two facets. However, the photonic chip may be aligned to both facets in order to capture most of the light generated by the laser source. Adding the U-turn region 105 in the embodiments herein avoids having to align the photonic chip to two facets when using AR coatings and when high optical efficiency is desired.

The optical couplers 155 can include any type of structure which optically couples optical components 160 to the DFB laser source 100. For example, the optical couplers 155 may covert a mode size of the light exiting from the facet 115 into a size that is compatible with waveguides in the photonic chip 150 that couple the optical couplers 155 to the optical components 160. These waveguides may be sub-micron waveguides. For example, the optical couplers 155 may include one or more prongs which taper in order to reduce the mode size to better match the dimensions of the waveguides in the photonic chip 150. Although FIG. 1 illustrates that the ends of the waveguide 120 bend in the facet 115 as the ends approach the AR coating 125 which may reduce parasitic reflections, this is not a requirement and the waveguide 120 may not bend or change direction when extending through the facet 115.

The optical components 160 can use the light received from the optical couplers 155 to perform any number of different functions such as combining the light, modulating the light according to a digital data signal, amplifying the light, transmitting the light to an external device (e.g., an optical cable), and the like. Thus, the optical components 160 can include optical combiners, modulators, transmitters, etc.

In one embodiment, the photonic chip 150 is formed using a silicon semiconductor substrate, while the DFB laser source 100 is formed on a different semiconductor substrate. For example, the DFB laser source 100 may be formed using a combinational semiconductor such as gallium arsenide, indium phosphide, or other III-V semiconductors. Moreover, although the photonic chip 150 is described herein as have a silicon substrate, it is not limited to such and can include other types of semiconductor material or dielectric material.

As shown, the waveguide 120 has two ends that terminate within the facet 115 at the AR coating 125. The AR coating 125 can be selected based on the light generated by the DFB laser source, which oscillates near the Bragg wavelength of the feedback grating. When compared to other types of lasers, the DFB laser source 100 has a very narrow line width and is stable over a wide range of operating conditions. Moreover, the design of the DFB laser source 100 can have a predefined phase shift ($\lambda/4$, $\lambda/8$, etc.) to improve mode suppression and avoid too much gain being localized in a particular area of the optical gain region 110.

Figure 2A:
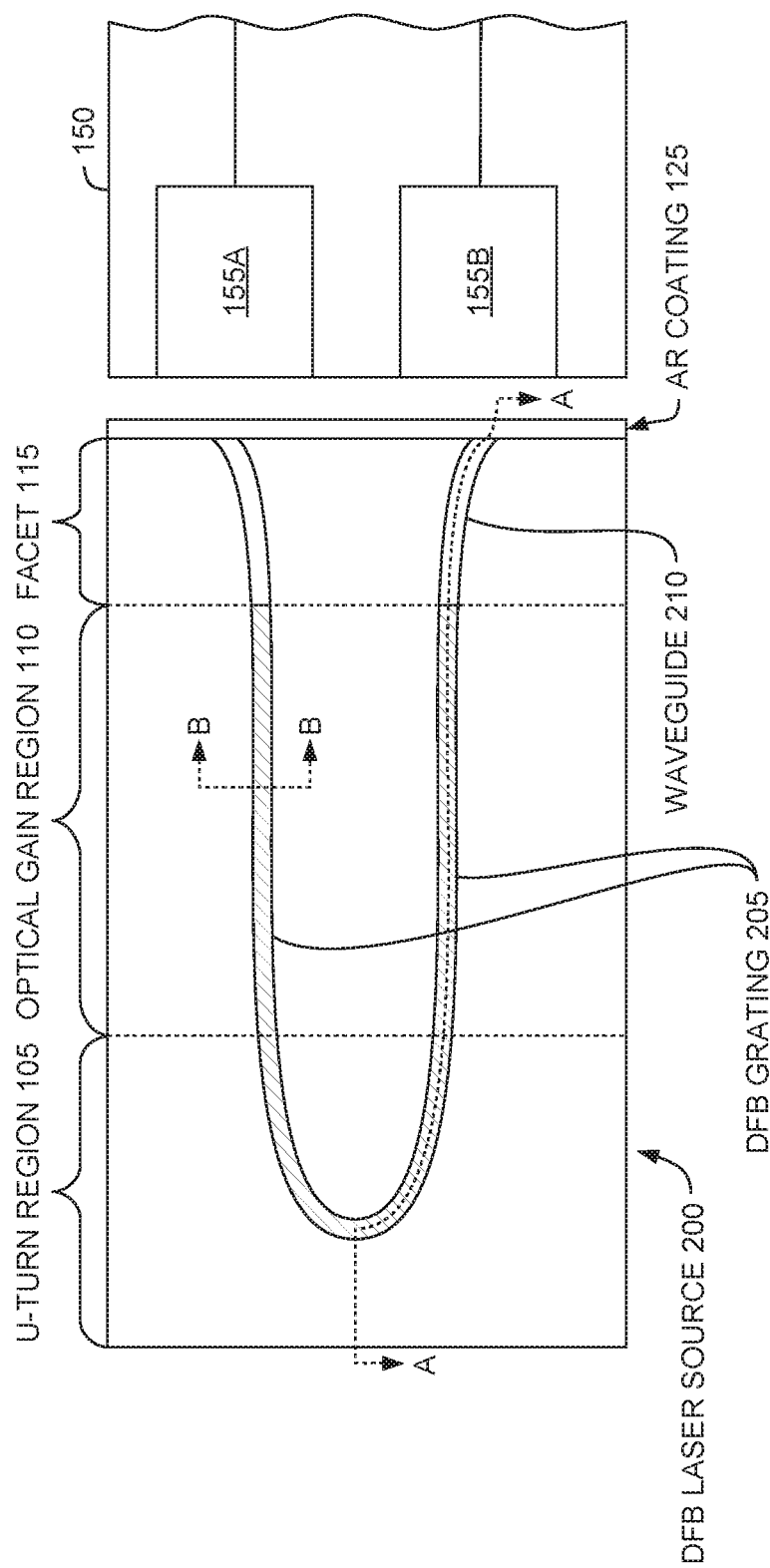

FIGS. 2A-2C illustrate a DFB laser source 200 coupled to a photonic chip 150, according to embodiments described herein. Like the laser source 100 in FIG. 1, the DFB laser source 200 includes the U-turn region 105 for reversing the direction of a waveguide 210, the optical gain region 110 for providing optical gain of the light in the waveguide 210, and a facet 115 for interfacing the two ends of the waveguide 210 with respective optical couplers 155A and 155B in the photonic chip 150.

The DFB laser source 200 includes a DFB grating 205 (also referred to as a feedback grating) which is disposed over the waveguide 210. That is, FIG. 2A illustrates a top view of the DFB laser source 200 where at least a portion of the waveguide 210 is occluded or covered by the grating 205. In this example, the DFB grating 205 extends over the portion of the waveguide 210 in the U-turn region 105 and the optical gain region 110 but not over the portion of the waveguide 210 in the facet 115. The DFB grating 205 can have the same width as the waveguide 210, but in other embodiments may be slight thinner or wider than the waveguide 210. Further, the DFB grating 205 forms one continuous grating. In other embodiments described below, a laser source can include two or more discrete gratings disposed over the waveguide 210.

The U-turn region 105 can be a passive or active region. A passive U-turn region 105 means that optical gain is not added when the light travels through the portion of the waveguide 210 in the U-turn region 105. However, an active U-turn region 105 means that current is applied in this region to generate optical gain. In this scenario, both the U-turn region 105 and the optical gain region 110 can amplify the light in the waveguide 210. In contrast, the facet 115 is a passive region. In one embodiment, the material of the waveguide 210 in a passive region is different than the material of the waveguide 210 in an active region (whether the U-turn region or the optical gain region 110). For example, the material of the waveguide 210 in the active regions may have a different bandgap than the material of the waveguide 210 in the passive regions. In one embodiment, the material of the waveguide 210 in the passive and active regions may be different alloys of the underlying semiconductor substrate.

In the U-turn region 105, the direction in which the waveguide 210 extends changes until the waveguide exits the U-turn region in the reverse direction it did when entering the region 105. Put differently, the waveguide 210 gradually bends in the U-turn region 105 to form a U-shape such that the ends of the waveguide 210 can terminate on the same facet 115. The radius of the bend in the U-turn region 105 can vary. For example, if the waveguide is formed from a rib or ridge (as shown in FIG. 2C) with a deeper etch (e.g., the rib has a 1-2 microns height), the radius of the bend can be shorter, e.g., around 10 microns. However, if the rib is formed with a shallower etch (e.g., the rib is less than a micron tall), the bend radius may be larger, e.g., between 10-500 microns. In general, the radius of the bend may depend on the ability of the waveguide 210 to sufficiently contain light as the direction in which the waveguide 210 extends changes.

FIG. 2B illustrates a cross section of the DFB laser source 200 in FIG. 2A as defined by the dotted line A-A which extends along one half of the waveguide 210. As shown, the DFB grating 205 forms a saw tooth pattern over the waveguide 210. The characteristics of the saw tooth pattern determine the wavelength of light that is reflected by the DFB grating 205. For example, the pitch of the DFB grating 205 can affect or set the line width or frequency of the light emitted by the laser source 200. In addition to the pitch, the gain spectrum of the DFB laser source 200 can also set the frequency of the light emitted by the laser source 200.

Although a saw tooth pattern is illustrated, the embodiments herein are not limited to such. For example, the grating 205 may include a square pattern, a series of separate ridges or lines, a series of slanted cuts or air gaps, and the like. In general, the gratings described herein can have any shape or be formed from any material which generates a narrow line width or a single longitudinal lasing mode. In addition, the grating region can be above the gain region, below the gain region, or to either or both sides. When the grating is on the sides, in essence the grating is periodically making the waveguide wider or narrower along the length.

As shown in FIG. 2B, the DFB grating 205 is a continuous grating that extends over the waveguide 210 in the optical gain region and the U-turn region but does not extend over the facet. As mentioned above, the DFB grating 205 serves as a type of mirror for reflecting a particular wavelength of light traveling in the waveguide 120 as optical feedback.

FIG. 2C illustrates a cross section of the DFB laser source 200 in FIG. 2A as defined by the dotted line B-B. Specifically, the cross section at dotted line B-B passes through an active region of the DFB laser source 200 (e.g., the optical gain region 110) where optical gain is added to the light. FIG. 2C illustrates an upper cladding 230, the DFB grating 205, an upper waveguide 235, an active region 220 (which includes quantum wells or quantum dots), a lower waveguide 240, and a lower cladding 245 disposed on a semiconductor substrate 215 which may be a combinational semiconductor such as an III-V semiconductor. In one embodiment, the material of the upper waveguide 235 and the lower waveguides 240 may be an alloy of the semiconductor substrate 215 such as an alloy of gallium arsenide or indium phosphide. Moreover, the cladding surrounding the waveguides may be any material with an index of refraction different from the index of refraction of the material of the waveguides such that light remains substantially contained in the waveguides as it propagates in the waveguides (e.g., in a direction into, and out of, the page). Moreover, the upper cladding 230 is shaped as a ridge.

The optical gain is provided by a current 225 that flows through the DFB laser source 200. That is, the active region 220 can include quantum wells or quantum dots (or any other optical active region) which, in response to the current 225, generate optical gain. In one embodiment, the current 225 is primarily a direct current (DC) although it may have some dither or alternating current (AC) component. Although not shown, the DFB laser source may include electrodes above and below the structure in FIG. 2C to generate the current 225. Unlike in FIG. 2C, a cross section of the waveguide 210 in a passive region (e.g., the facet 115 or a passive U-turn region 105) may not include the quantum wells or electrodes for generating the current 225. Moreover, as mentioned above, the material of the waveguide may be different in a passive region than in an active region. Further, a cross section of the waveguide in the direction established by the dotted line B-B in the facet 115 would exclude the DFB grating 205.

Figure 3:
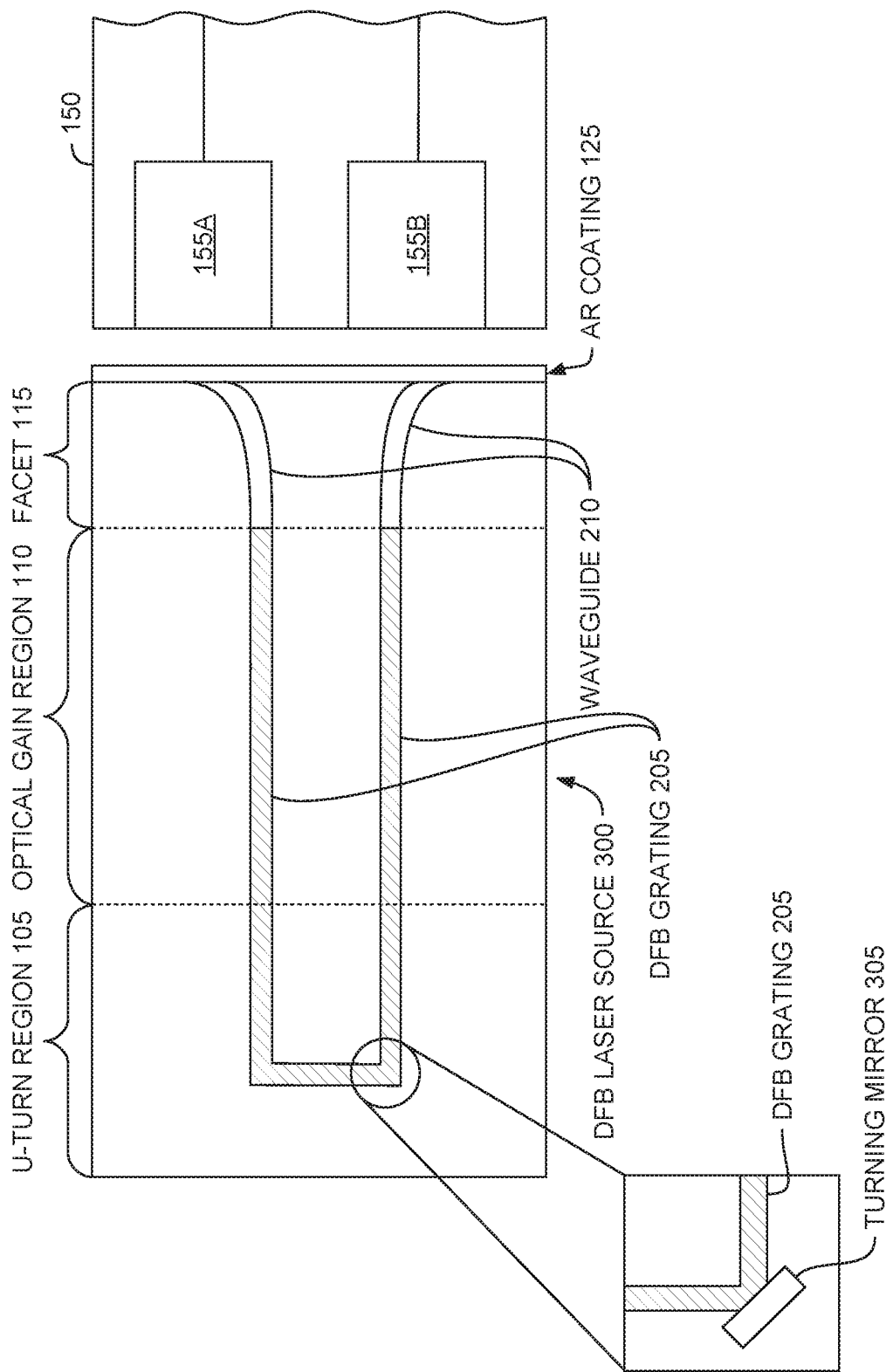
FIG. 3 illustrates a DFB laser source coupled to a photonic chip, according to one embodiment described herein.

FIG. 3 illustrates a DFB laser source 300 coupled to a photonic chip 150, according to one embodiment described herein. FIG. 3 illustrates a top view of the DFB laser source 300. Like in FIG. 2A, the DFB laser source 300 includes a continuous DFB grating 205 disposed over the portions of the waveguide 210 within the U-turn region 105 and the optical gain region 110 but not in the facet 115. As such, the cross-sections illustrated in FIGS. 2B and 2C would similarly apply here. However, instead of using a gradual bend in the U-turn region 105 to reverse directions of the waveguide 210, the U-turn region 105 can include two turning mirrors 305 disposed at two corners.

In one embodiment, the turning mirrors 305 are etched features in the semiconductor substrate. The turning mirrors 305 may use total internal reflection in order to redirect the light at a ninety degree angle. By using two turning mirrors 305, the U-turn region 105 can redirect the light 180 degrees so that the waveguide 210 exits the U-turn region 105 in the opposite direction it entered the region 105. Moreover, the U-turn region 105 can be a passive or active region.

Figure 4A:
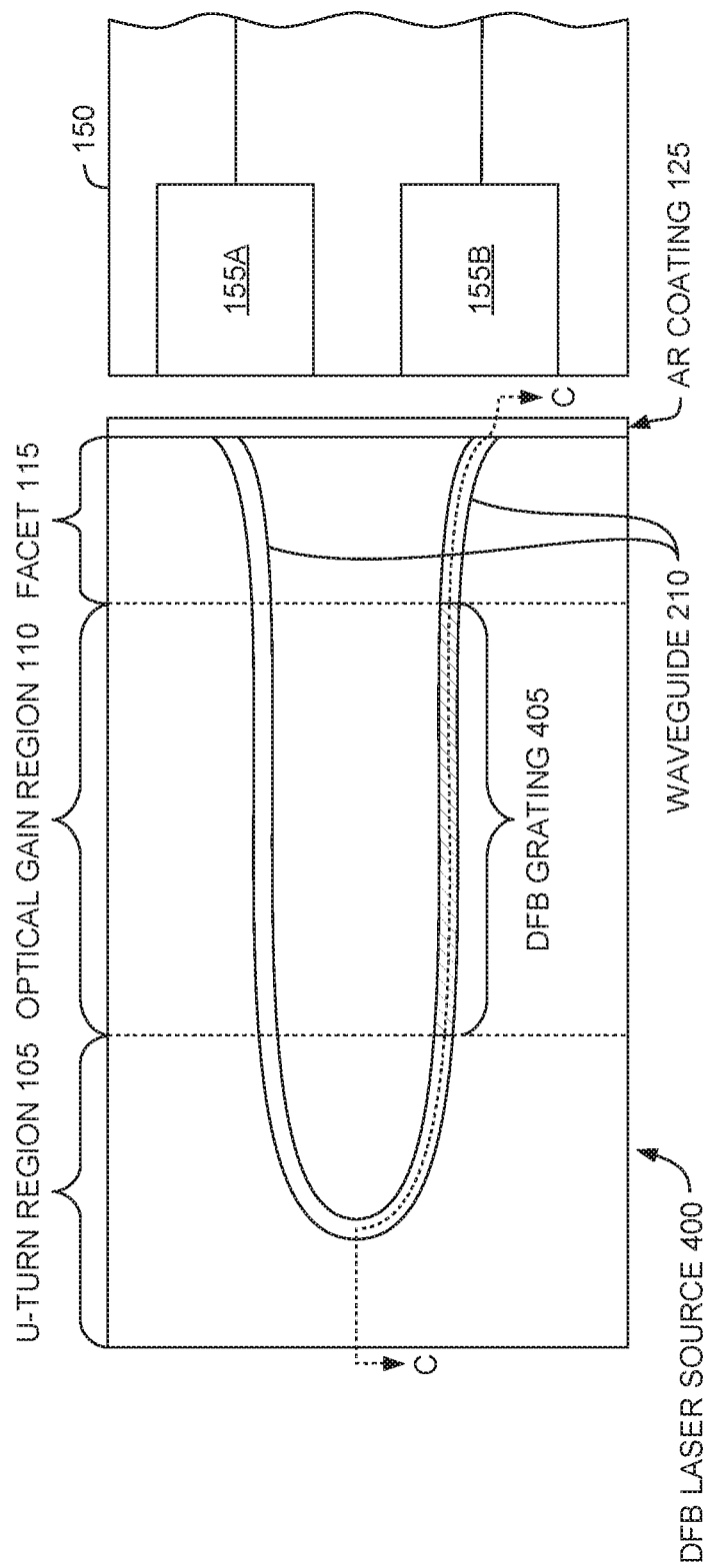
FIGS. 4A and 4B illustrate a DFB laser source coupled to a photonic chip, according to one embodiment described herein.
Figure 4B:
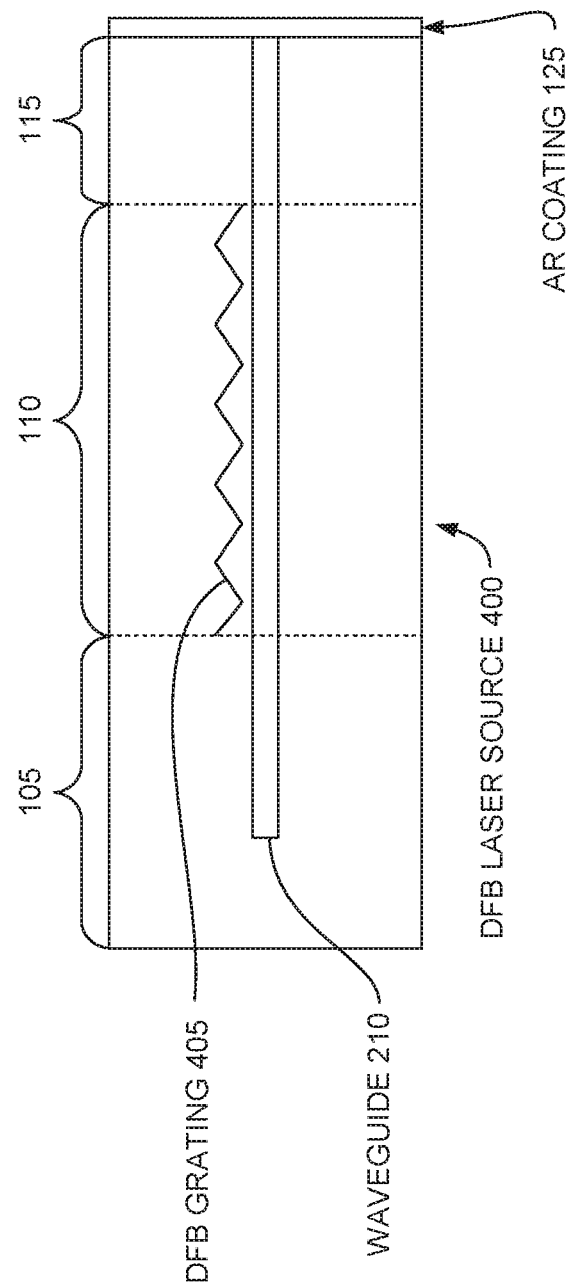

FIGS. 4A and 4B illustrate a DFB laser source 400 coupled to a photonic chip 150, according to one embodiment described herein. FIG. 4A illustrates a top view of the DFB laser source 400. As above, the DFB laser source 400 includes the U-turn region 105 (which can be active or passive), the optical gain region 110, and the facet 115. While the DFB laser source 400 illustrates using a gradual bend in the waveguide 210 within the U-turn region 105, in another embodiment, the region 105 can include the turning mirrors 305 to redirect the light in the waveguide as shown in FIG. 3.

In FIG. 4A, a DFB grating 405 is disposed over the waveguide 210 solely within the optical gain region 110. That is, the grating 405 does not extend into the facet 115 and the U-turn region 105. Furthermore, the lower portion of the waveguide 210 in the optical gain region 110 includes the DFB grating 405 while no DFB grating 405 covers the upper portion of the waveguide 210 in the optical gain region 110. In one embodiment, it may be difficult to form the DFB grating in the U-turn region where the waveguide bends or turns, and thus, and embodiment shown here where the DFB grating 405 is disposed in a region where the waveguide 210 is straight may improve the performance of the grating 405. Moreover, a sub-portion of the optical gain region 110 may generate optical gain in the waveguide 210. For example, the portion of the waveguide 210 in the lower half of the optical gain region 110 may generate optical gain while the portion of the waveguide 210 in the upper half of the region 110 (which does not have the DFB grating 405) does not provide optical gain.

Although the DFB grating 405 in FIG. 4A is smaller than the gratings in the previous embodiments, the grating 405 is nonetheless sufficient to provide a narrow line width. Put differently, the DFB laser source 400 can have a single longitudinal lasing mode and stable operation with the DFB grating 405. Thus, as the light passes through portion of the waveguide 210 on which the grating 405 is disposed, the grating 405 reflects a narrow band of wavelengths to produce the narrow line width.

The upper portion of the waveguide 210 in the optical gain region 110 (which is not covered by the grating 405) may have more optical gain than the lower portion of the waveguide 210 which is covered by the grating 405. Thus, the light generated by the DFB laser source 400 may have a greater intensity than light generated by the DFB laser source 200 in FIG. 2A where the DFB grating 205 is formed over the waveguide 210 in the U-turn and optical gain regions 105, 110. However, having a shorter or smaller DFB grating 405 as shown in FIG. 4A may raise the noise floor in the optical signal generated by the DFB laser source 400 relative to the noise floor of the optical signal generated by the DFB laser source 200.

FIG. 4B illustrates a cross section of the DFB laser source 400 in FIG. 4A as defined by the dotted line C-C which extends along one half of the waveguide 210. While the grating 405 is disposed over the portion of the waveguide 210 in the optical gain region 110, the portions of the waveguide 210 along the dotted line A-A in the U-turn region 105 and the facet 115 are not covered by the grating. In one example, the grating 405 in the optical gain region 110 shown in FIG. 4B is the only feedback grating in the DFB laser source 400.

As shown by viewing the side of the DFB laser source 400, the DFB grating 405 has a similar saw tooth pattern as the gratings in previous embodiments. The characteristics of the saw tooth pattern determine the wavelength of light that is reflected by the DFB grating 405. For example, the pitch of the DFB grating 405 can affect or set the line width or frequency of the light emitted by the laser source 400.

Although a saw tooth pattern is illustrated, the embodiments herein are not limited to such. For example, the grating 405 may include a square pattern, a series of separate ridges or lines, a series of slanted cuts or air gaps, and the like. In general, the gratings described herein can have any shape or be formed from any material which generates a narrow line width or a single longitudinal lasing mode. In addition, the grating region can be above the gain region, below the gain region, or to either or both sides. When the grating is on the sides, in essence the grating is periodically making the waveguide wider or narrower along the length.

In another embodiment, rather than the DFB grating being disposed solely in the optical gain region 110, the DFB grating can be disposed solely in the U-turn region 105. That is, the DFB grating may be disposed within the U-turn region 105 and not in the optical gain region 110 or the facet 115. In this example, the U-turn region 105 is active. In turn, the optical gain region 110 may be active or passive.

Figure 5:
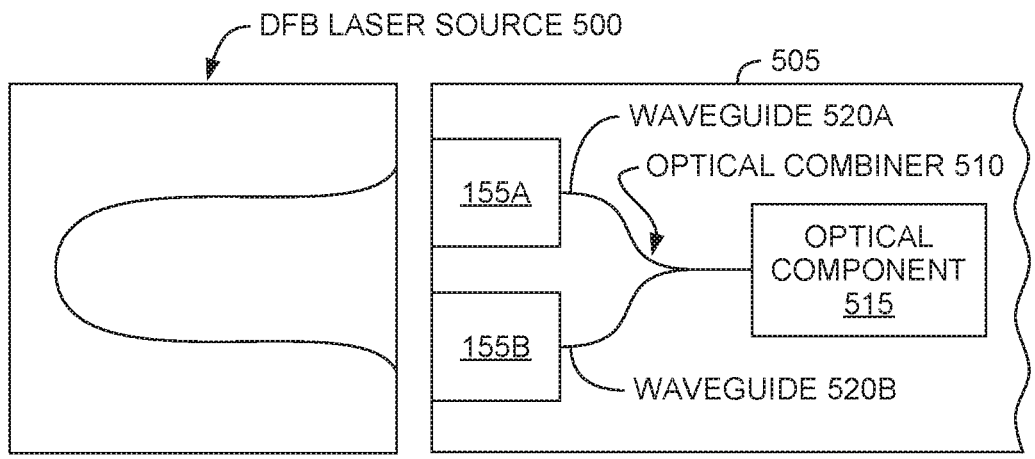
FIG. 5 illustrates a DFB laser source coupled to a photonic chip, according to embodiments described herein.

FIG. 5 illustrates a DFB laser source 500 coupled to a photonic chip 505, according to embodiments described herein. The DFB laser source 500 is shown generically and could be any of the DFB laser sources 200, 300, or 400 illustrated in FIGS. 2A, 3, and 4A. In FIG. 5, the optical signals emitted by the DFB laser source 500 are received by the two optical couplers 155. In turn, these couplers 155 are coupled to waveguides 520 which transmit the optical signals to an optical combiner 510. The optical combiner may be a multimode interference (MMI) optical splitter/combiner or a Y-branch splitter/combiner. The lengths of the waveguides 540 may be tightly controlled so that the phases of the respective optical signals align at the optical combiner 510.

The optical combiner 510 transmits the combined optical signal to an optical component 515 (e.g., a modulator, transmitter, amplifier, etc.). In this manner, the photonic chip 505 receives two optical signals from the DFB laser source 500 using the two ends of the waveguides and the optical couplers 155 and then combines those optical signals into a single signal before providing the signal to the optical component 515. As a result, the optical system illustrated in FIG. 5 is similar to HR/AR DFB laser source that is coupled to a photonic chip using the AR coated facet of the laser source. Stated differently, because the photonic chip 505 combines the two optical signals emitted by the AR coated facet of the DFB laser source 500 into a single signal, the optical system has low optical loss like an HR/AR laser but with the advantage of using a single AR coated facet, which avoids instability that can occur from a mechanical process used to fabricate the HR coated facet of an HR/AR laser source. In this manner, the two optical signals emitted by the DFB laser source 500 can be combined into a single optical signal that can be transmitted to the optical component 515.

Figure 6:
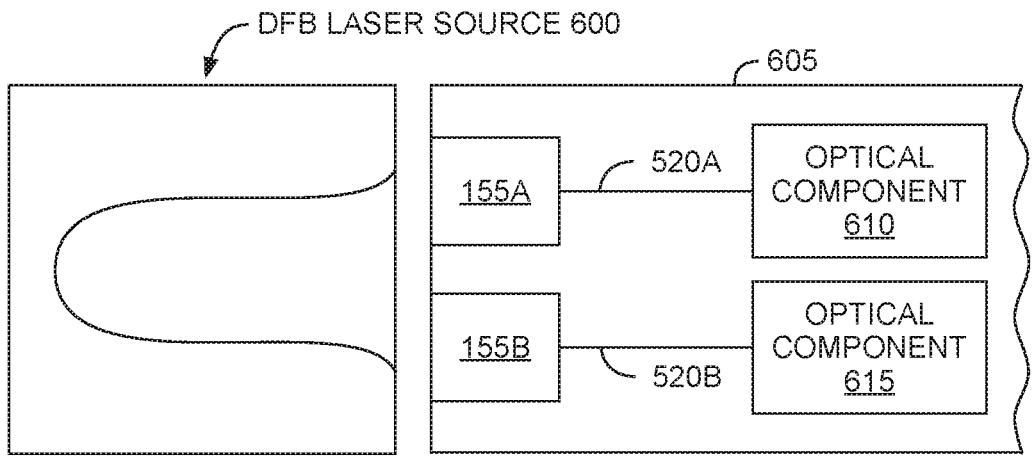
FIG. 6 illustrates a DFB laser source coupled to a photonic chip, according to embodiments described herein.

FIG. 6 illustrates a DFB laser source 600 coupled to a photonic chip 605, according to embodiments described herein. The DFB laser source 600 is shown generically and could be any of the DFB laser sources 200, 300, or 400 illustrated in FIGS. 2A, 3, and 4A. In FIG. 6, the optical signals emitted by the DFB laser source 600 are received by the two optical couplers 155. In turn, these couplers 155 are coupled to waveguides 520. However, unlike in FIG. 5, here the waveguides 520 are not attached to an optical combiner but instead form two independent optical paths. As shown, the optical signal in the waveguide 520A is transmitted to a different optical component 610 than the optical signal in the waveguide 520B which is transmitted to the optical component 615.

For example, the optical components 610 and 615 could be two separate modulators which modulate respective optical signals received from the DFB laser source 600 using independent electrical data signals. In this example, the DFB laser source 600 can be thought of as two different laser sources which output two optical signals that can be used in separate optical paths within the photonic chip 605. The optical signals generated by the DFB laser source 600 may have substantially the same frequency content (e.g., line width) and intensity. So long as the intensity of the optical signals is sufficient, a single DFB laser source 600 can perform the same function as two different laser sources that are coupled to the photonic chip 605.

Figure 7:
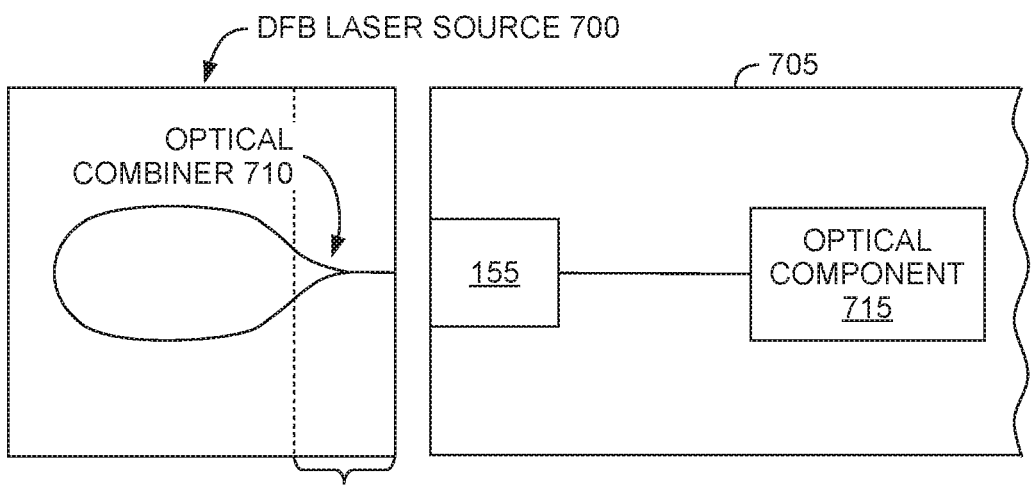
FIG. 7 illustrates a DFB laser source coupled to a photonic chip, according to embodiments described herein.

FIG. 7 illustrates a DFB laser source 700 coupled to a photonic chip 705, according to embodiments described herein. Unlike in the previous embodiments, the DFB laser source 700 includes an optical combiner 710 in the facet 115. That is, instead of the two ends of the waveguide terminating at different locations in the facet 115, the ends of the waveguides meet (or terminate) at the optical combiner 710 (e.g., a MMI splitter/combiner or a Y-branch splitter/combiner). The output of the optical combiner 710 then terminates at the AR coating of the facet 115.

The photonic chip 705 includes a single optical coupler 155 for receiving the combined optical signal emitted from the optical coupler 710 and the facet 115. That is, unlike in the previous embodiments, the photonic chip 705 can use one optical coupler 155 rather than several. The output of the optical coupler is then coupled to an optical component 715 (e.g., a modulator, transmitter, etc.). Thus, in FIG. 7, the optical combiner 710 is moved onto the DFB laser source 700 rather than in FIG. 5 where the optical combiner 510 is in the photonic chip 505. One advantage of doing so is that aligning the DFB laser source 700 to the photonic chip 705 may be less complicated since there is one coupler 155 that is aligned to the DFB laser source 700 rather than two. For example, when using one optical coupler 155, the rotation of the DFB laser source 700 and the photonic chip 705 along an axis that extends through the output of the optical combiner 710 and the optical coupler 155 is less important to ensuring sufficient optical coupling between the laser source 700 and the photonic chip 705.

However, when placing the optical combiner 710 on the DFB laser source 700 the phase of the optical signal may be tightly controlled to prevent destructive interference. Further, when the optical signals are combined in the laser source 700, it prevents the laser source 700 from being used as two separate laser sources as shown in FIG. 6 unless, for example, an optical splitter is disposed in the optical chip 705 between the optical coupler 155 and the optical component 715.

In the DFB laser source 700, the U-turn region and the optical gain region to the left of the facet 115 can be the same as the U-turn and the optical gain regions discussed above in the DFB laser sources 200, 300, or 400 illustrated in FIGS. 2A, 3, and 4A. That is, the U-turn region in the laser source 700 could have a gradual bend as shown or use turning mirrors. Also, the U-turn region could be active or passive. Further, the DFB grating could be disposed over all of the waveguide in the U-turn and optical gain regions or over a portion of these regions.

Figure 8A:
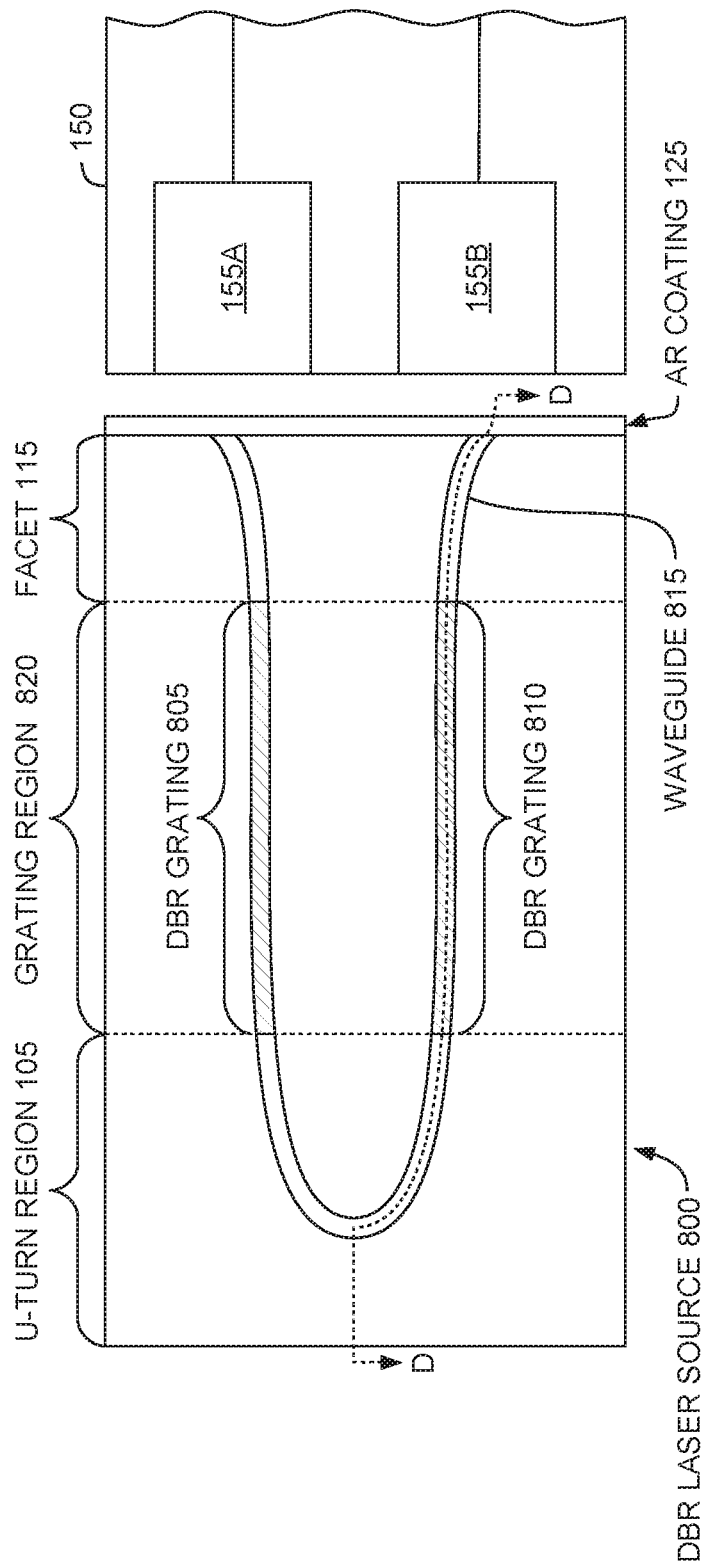
FIGS. 8A and 8B illustrate a distributed Bragg reflector laser source coupled to a photonic chip, according to embodiments described herein.
Figure 8B:
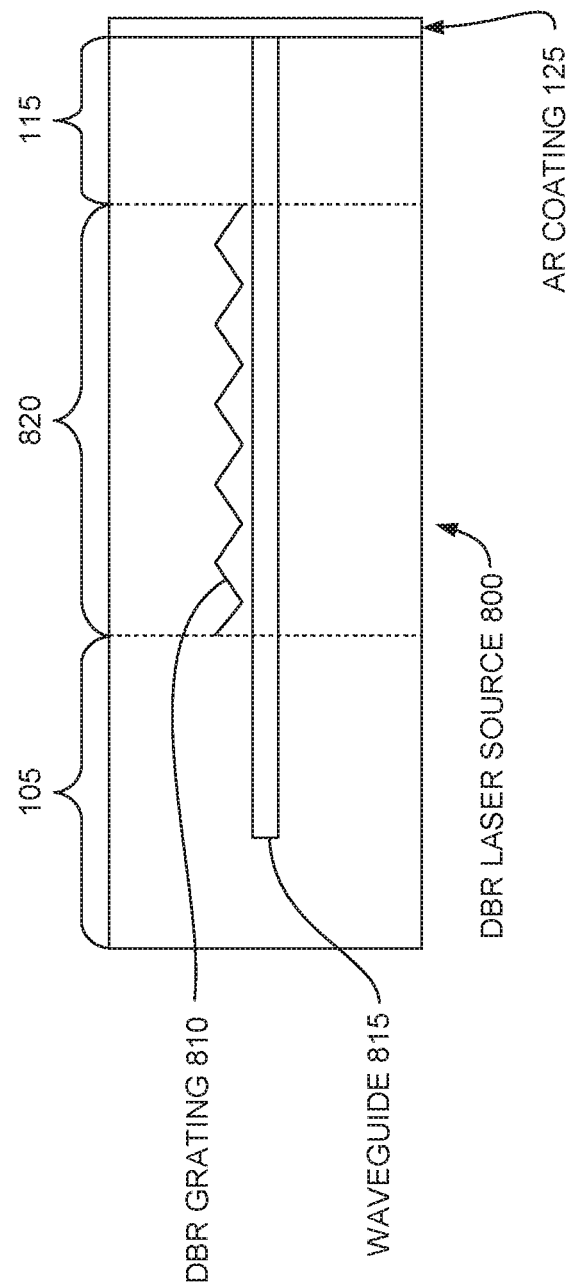

FIGS. 8A and 8B illustrate a distributed Bragg reflector (DBR) laser source 800 coupled to a photonic chip 150, according to embodiments described herein. Unlike in the DFB laser sources above, the DBR laser source 800 includes multiple discontinuous or separate gratings over a waveguide 815 rather than a single, continuous grating. In this example, the laser source 800 includes a DBR grating 810 disposed over a lower portion of the waveguide 815 in a grating region 820 (or an intermediate region) and a DBR grating 805 disposed over an upper portion of the waveguide 815 in the grating region 820. There is not a grating in the U-turn region 105 or the facet 115. As such, the DBR gratings 805 and 810 are separate gratings.

In one embodiment, the characteristics and dimensions of the DBR gratings 805, 810 are set such that the DBR laser functions similar to the DFB laser sources described above where substantially equivalent optical signals are emitted from the two ends of the waveguide 815. However, in another embodiment, the characteristics or dimension of the DBR gratings 805, 810 are purposefully different so that the optical signals emitted from the two ends of the waveguide 815 are different in a desired way—e.g., different wavelengths. For example, by changing the local index on one of the gratings, a designer can change the spectral reflectivity of the grating relative to the other grating.

In one embodiment, the grating region 820 (which includes the DBR gratings 805, 810) is passive while the U-turn region 105 is active to provide the optical gain.

The ends of the waveguide 815 are aligned with respective optical couplers 155 in the photonic chip 150. In one embodiment, the outputs of the optical couplers 155 are coupled to an optical combiner to generate a combined optical signal which is then transmitted to another optical component in the chip 150 (like the photonic chip 505 in FIG. 5). Alternatively, the outputs of the optical couplers 155 can be coupled to different optical components to form independent optical paths in the chip 150 (like the photonic chip 605 in FIG. 6).

FIG. 8B illustrates a cross section of the DBR laser source 800 in FIG. 8A as defined by the dotted line D-D which extends along one half of the waveguide 815. From this side view, the DBR grating 810 above the portion of the waveguide 815 in the optical gain region 110 is visible. Again, the grating 810 does not extend into the U-turn region 105 or the facet 115. The shape of the DBR grating 810 is a saw tooth pattern but is not limited to such. For example, the gratings 805 and 810 may include a square pattern, a series of separate ridges or lines, a series of slanted cuts or air gaps, and the like. In general, the gratings described herein can have any shape or be formed from any material which generates a narrow line width or a single longitudinal lasing mode. In addition, the grating region can be above the gain region, below the gain region, or to either or both sides. When the grating is on the sides, in essence the grating is periodically making the waveguide wider or narrower along the length.

In another embodiment, the structure shown in FIG. 8A is used to form two DFB laser sources (e.g., coupled-cavity lasers) instead of two DBR laser sources. That is, the grating 805 can be used to generate a first DFB laser source while the grating 810 generates a second DFB laser source. Further, the grating region 820 is an active region unlike in the DBR laser source 800 where the grating region 820 is passive.

In view of the foregoing, the scope of the present disclosure is determined by the claims that follow.

We claim:

1. A laser source, comprising:
   a facet coated with an anti-reflective (AR) coating;
   an intermediate region;
   a U-turn region, wherein the intermediate region is between the facet and the U-turn region;
   a waveguide extending through the facet, the intermediate region, and the U-turn region, wherein a first portion of the waveguide in the U-turn region changes direction such that the waveguide exits the U-turn region in an opposite direction than the first portion of the waveguide entered the U-turn region, wherein first and second ends of the waveguide terminate at the facet; and
   a grating disposed over a second portion of the waveguide in at least one of the intermediate region and the U-turn region,
   wherein the grating is disposed in an optical gain region that provides optical gain to a signal propagating in the waveguide, wherein the grating is disposed over a center of the waveguide in a direction of propagation of the signal in the waveguide.

2. The laser source of claim 1, wherein the grating is disposed over a third portion of the waveguide extending through the intermediate region that is spaced apart from the second portion of the waveguide extending through the intermediate region, wherein the grating is continuous over the second and third portions of the waveguide.

3. The laser source of claim 1, wherein the grating is disposed only in the intermediate region, wherein a third portion of the waveguide disposed in the intermediate region is spaced apart from the second portion of the waveguide in the intermediate region, wherein the third portion of the waveguide does not include any grating.

4. The laser source of claim 1, wherein the laser source includes one continuous grating associated with the waveguide.

5. The laser source of claim 1, wherein a material of the waveguide in the facet is different from a material of the waveguide in the intermediate region.

6. The laser source of claim 1, wherein the U-turn region is a passive region.

7. The laser source of claim 1, wherein the first and second ends are arranged in the facet to emit respective optical signals to an external optical component.

8. The laser source of claim 1, further comprising:
an optical combiner disposed in the facet, wherein the first and second ends terminate at the optical combiner, wherein an output of the optical combiner is configured to emit an optical signal to an external optical component.

9. The laser source of claim 1, further comprising:
a semiconductor substrate on which the U-turn region, the intermediate region, the facet, and the waveguide are disposed.

10. A laser source, comprising:
a facet coated with an anti-reflective (AR) coating;
an intermediate region;
a U-turn region, wherein the intermediate region is between the facet and the U-turn region;
a waveguide extending through the facet, the intermediate region, and the U-turn region, wherein a first portion of the waveguide in the U-turn region changes direction such that the waveguide exits the U-turn region in an opposite direction than the first portion of the waveguide entered the U-turn region, wherein first and second ends of the waveguide terminate at the facet; and
a grating disposed over a second portion of the waveguide in at least one of the intermediate region and the U-turn region,
wherein the U-turn region provides optical gain to a signal propagating in the waveguide.

11. An optical system, comprising:
a laser source comprising:
a facet coated with an anti-reflective (AR) coating,
an intermediate region,
a U-turn region,
a waveguide extending through the facet, the intermediate region, and the U-turn region, wherein a first portion of the waveguide in the U-turn region changes direction such that the waveguide exits the U-turn region in an opposite direction than the first portion of the waveguide entered the U-turn region, wherein first and second ends of the waveguide terminate at the facet, and
a grating disposed over a second portion of the waveguide in at least one of the intermediate region and the U-turn region, wherein the grating is disposed in an optical gain region that provides optical gain to a signal propagating in the waveguide, wherein the grating is disposed over a center of the waveguide in a direction of propagation of the signal in the waveguide; and
a photonic chip comprising:
a first optical coupler aligned to the laser source to receive a first optical signal emitted from the first end of the waveguide via the facet, and
a second optical coupler aligned to the laser source to receive a second optical signal emitted from the second end of the waveguide via the facet.

12. The optical system of claim 11, wherein the U-turn region provides optical gain to a signal propagating in the waveguide.

13. The optical system of claim 11, wherein the photonic chip comprises:
an optical combiner coupled to an output of the first optical coupler and an output of the second optical coupler and configured to combine the first and second optical signals into a combined optical signal; and
an optical component coupled to an output of the optical combiner to receive the combined optical signal.

14. The optical system of claim 11, wherein the photonic chip comprises:
a first optical component coupled to an output of the first optical coupler; and
a second optical component coupled to an output of the second optical coupler, wherein the first optical component and first optical coupler establish a first optical path that is independent of a second optical path formed by the second optical component and the second optical coupler.

15. The optical system of claim 11, wherein the second portion of the waveguide and the grating extends through both the intermediate region and the U-turn region.

16. The optical system of claim 11, wherein the grating is disposed over a third portion of the waveguide extending through the intermediate region that is spaced apart from the second portion of the waveguide extending through the intermediate region, wherein the grating is continuous over the second and third portions of the waveguide.

17. The optical system of claim 11, wherein the grating is disposed only in the intermediate region, wherein a third portion of the waveguide disposed in the intermediate region is spaced apart from the second portion of the waveguide in the intermediate region, wherein the third portion of the waveguide does not include any grating.

18. The optical system of claim 11, wherein the laser source includes one continuous grating associated with the waveguide.

19. The optical system of claim 11, wherein a material of the waveguide in the facet is different from a material of the waveguide in the optical gain region.

20. The optical system of claim 11, wherein the U-turn region is a passive region.

* * * * *